United States Patent [19]
Richardson

[11] Patent Number: 5,905,962
[45] Date of Patent: May 18, 1999

[54] APPARATUS AND METHOD FOR DATA TRANSMISSION TO INHIBIT RADIO SIGNAL FADING WITH SEQUENTIAL TRANSMISSION OF DATA GROUPS BASED UPON POWER LEVELS

[75] Inventor: Andrew Richardson, Surrey, United Kingdom

[73] Assignee: Nokia Mobile Phones Ltd., Salo, Finland

[21] Appl. No.: 08/573,501

[22] Filed: Dec. 15, 1995

[30] Foreign Application Priority Data

Dec. 23, 1994 [GB] United Kingdom ............ 9426469

[51] Int. Cl.⁶ ........................................... H04B 1/10
[52] U.S. Cl. ........................ 455/522; 455/63; 455/506; 375/200
[58] Field of Search ............................ 455/126, 127, 455/69, 70, 103, 63, 67.1, 52.1, 52.3, 50.1, 501, 504, 506, 522, 574, 38.3, 343; 375/200

[56] References Cited

U.S. PATENT DOCUMENTS

| | | |
|---|---|---|
| 4,567,602 | 1/1986 | Kato et al. .................. 375/296 |
| 5,345,593 | 9/1994 | Dent .......................... 455/127 |
| 5,349,630 | 9/1994 | Sointula . |
| 5,396,653 | 3/1995 | Kivari et al. . |
| 5,430,740 | 7/1995 | Kivari et al. . |
| 5,579,306 | 11/1996 | Dent ........................ 455/38.3 |
| 5,603,096 | 2/1997 | Gilhousen et al. ........... 455/522 |

FOREIGN PATENT DOCUMENTS

| | | |
|---|---|---|
| 0110009 | 6/1984 | European Pat. Off. . |
| 0369135 | 5/1990 | European Pat. Off. . |
| 9317506 | 9/1993 | WIPO .................... 455/103 |

OTHER PUBLICATIONS

Japanese Patent Abstract No. 1-227534, "Mobile Communication Control System", Nippon Telegraph, Nov. 09, 1989.

*Primary Examiner*—Doris H. To
*Attorney, Agent, or Firm*—Perman & Green, LLP

[57] ABSTRACT

Radio communication apparatus and method for inhibiting radio signal Rayleigh fading comprises apparatus for varying a nominal output power level in accordance with a sequence of power levels. The sequence may be pseudo-random. The nominal output power level may be one of the system power levels inhibiting normal fading and the sequence of power levels varies the output power in a range between adjacent nominal power levels.

26 Claims, 3 Drawing Sheets

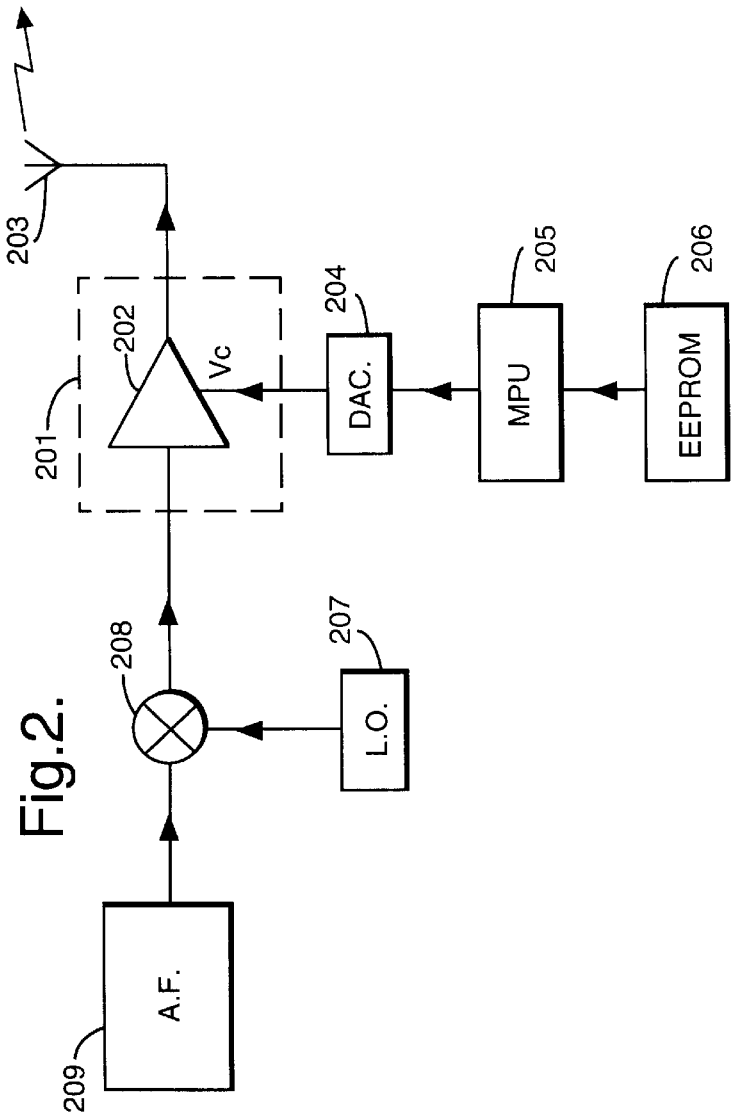

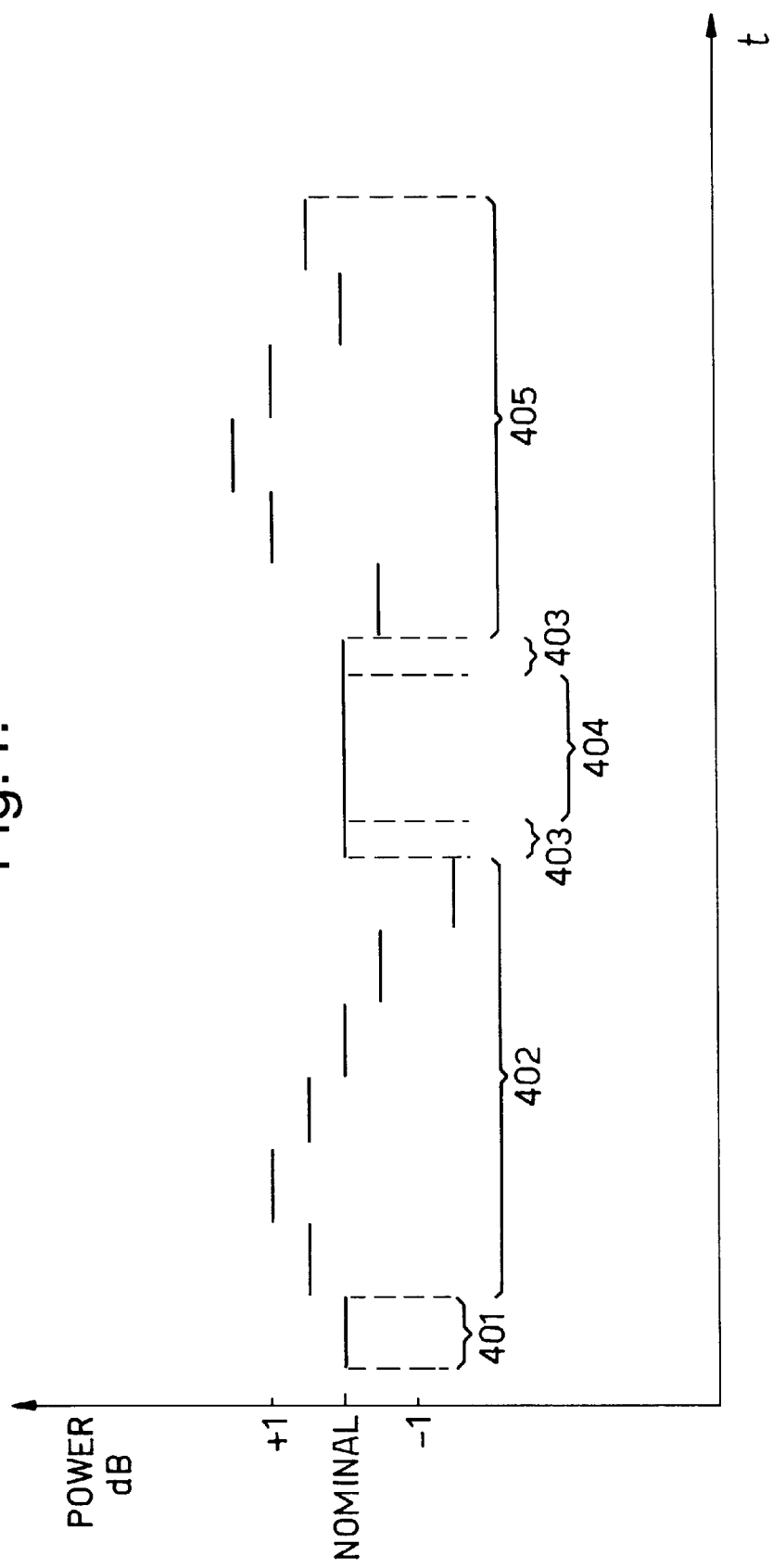

APPARATUS AND METHOD FOR DATA TRANSMISSION TO INHIBIT RADIO SIGNAL FADING WITH SEQUENTIAL TRANSMISSION OF DATA GROUPS BASED UPON POWER LEVELS

FIELD OF INVENTION

The present invention relates to apparatus and a method for controlling the output power of communication devices and to a communication system utilising the apparatus and method. In particular the present invention relates to power control circuitry in a communication system such as a radio telephone network.

BACKGROUND TO INVENTION

Existing communication systems suffer from a number of problems which act to degrade the quality of communication between a transmitting unit and a receiving unit within the communication system. In particular, in a radio telephone network for example, which comprises a plurality of mobile stations or radio telephones communicating with a base station connected to other base stations in the radio telephone network, both the radio telephone and the base station are relatively close to ground level. Since the base station and radio telephone are close to ground level obstacles such as buildings, walls, cars and people hinder the direct line of sight between them especially in urban areas. Thus, they typically communicate by reflected or diffracted radio wave signals. Due to the multiple reflections and diffractions the r.f. power received by a radio telephone or a base station is at a much lower level than would be expected from the inverse square law if direct line of sight communication was possible. Typically, the power loss is of the form $d^{-\alpha}$ where d is the distance between the transmitting and receiving stations and $\alpha$ lies between 3 and 4. This power loss is known as path loss.

The problem of path loss has been addressed in known radio telephone systems by the base stations monitoring the strength of signals received from various radio telephones communicating therewith and from time to time issuing a request over the air for an individual radio telephone to increase or decrease its transmitting power. The radio telephone responds by adjusting the gain of its transmitting amplifier which is typically under microprocessor control. Generally, the amplifier is operable at one of a plurality of predetermined output power levels which are selected automatically in response to the request from the base station for a change in the level of the output power. Typically, the power levels are defined in the radio telephone system specification. For each power level a nominal value is specified together with a permitted tolerance range.

In addition to the normal fading there is another form of fading known as Rayleigh fading. This type of fading is a short term fading and is characterised by rapid variations in the r.f. power level of a signal received by a radio telephone or base station. It is caused by the multiple signal paths arising from the reflections and diffractions forming a quasi-stationary standing wave pattern with nulls at approximately half wavelength intervals of the signal frequency.

The effect of the periodic nulls in received signal power due to Rayleigh fading is that transmitted data may be lost thereby introducing errors into the transmission. In order to ensure that there is sufficient integrity in the radio telephone network redundant data has to be sent such as error-correcting codes. This results in a reduced information or data handling capacity for the network.

Heretofore, the problems of Rayleigh fading have been addressed by using a technique known as Slow Frequency Hopping (SFH) or Frequency Hopping. In this technique, the carrier frequency of a particular communication channel is discontinuously changed between discrete carrier frequencies of a set of defined carrier frequencies. Since the Rayleigh fading of signals at different frequencies is not the same, and becomes increasingly different as the difference between the frequencies increases, frequency hopping for a particular communication channel substantially reduces the effects of Rayleigh fading for that communication channel effectively transforming errors due to Rayleigh fading into widely spread random errors. Another advantage is that co-channel interference from other cells is reduced.

In the known GSM system for cellular radio telephony, the sequence of data bursts making up a particular communication channel or Traffic CHannel (TCH) are cyclically assigned to different frequencies by the base station handling that communication channel. Additionally, a technique known as interleaving is employed in the GSM system. This involves jumbling up data to be transmitted such that normally adjacent groups of data are transmitted at different times, and de-interleaving the transmitted signal at the receiver.

A disadvantage of a system using frequency hopping is that the "memory" of the radio propagation channel is lost. This so-called "memory" arises because a radio propagation channel can be considered a time-variant linear filter. Such a filter has a well-defined auto-correlation function, and there is a limit to the variation in a signal level between two closely spaced points (of the order of a half wavelength). If a signal strength is known at one point then with a defined confidence interval it can be predicted at a next closely spaced point. Thus, the radio propagation channel can be considered to have a "memory".

Loss of the memory of a communication channel results in accurate and fast power control being difficult to achieve. Furthermore, frequency hopping does not remove the generation of r.f. signal nulls and overcoming such nulls by fast power control cannot be achieved since there is no memory in the communication channel and the occurrence of nulls cannot be predicted. Additionally, frequency hopping requires relatively complex circuitry both in the base stations and radio telephones in order to ensure that the correct frequency is used at each time. In particular, the frequency synthesizers and the Tx and Rx circuitry are complex. There must also be a substantial number of carrier frequencies for the communication channels to jump to and this may not always be possible in a crowded r.f. spectrum. Also, it is possible that two or more different communication channels will simultaneously land on the same frequency which will cause gross interference.

BRIEF SUMMARY OF INVENTION

In a first aspect the present invention provides radio communication apparatus for inhibiting radio signal fading comprising output power amplifying means responsive to a control signal from an output power control means for varying a predetermined output power level from the output power amplifying means in accordance with a sequence of power levels, and in a second aspect the present invention provides a method for inhibiting radio signal fading between a transmission means and a receiving means comprising varying a predetermined output power level output from the transmission means in accordance with a sequence of power levels.

Advantages of the present invention include an increase in capacity for communication systems utilising the invention. This arises because the inhibiting of radio signal fading means that the extra power typically output to provide for fade margins can be reduced and hence there is less likelihood of interference with other communication channels or users of the system. Additionally, less power is consumed by devices utilising the present invention since the fade margin can be reduced. This is particularly advantageous for hand held portable devices where it is desirable for battery power consumption to be minimized. A further advantage is that frequency hopping does not need to be utilised to avoid signal fading, thus the memory or knowledge of a communication channel is not lost. Also, the length of error bursts is shortened by the present invention and hence the interleaving depth can be reduced to a single traffic burst in the GSM system, for example. Reducing the interleaving depth reduces transmission delay and thus improves the speech quality. Apparatus and method in accordance with the invention results in similar effects to frequency hopping. This means that frequency hopping can be disabled, and more accurate power control algorithms can be utilised.

Apparatus in accordance with the invention has the further advantage that power levels can be varied around the nominal system power levels, typically used to address normal fading. A nominal system power level is typically selectable from a range of nominal power levels. Suitably the variation around the nominal power levels is such that the variation keeps within the power range between adjacent nominal power levels of the range of nominal power levels.

Preferably data is divided into groups prior to transmission and the respective groups are transmitted at respective power levels in accordance with the sequence of power levels. This has the advantage that the power level variations do not have to vary at a bit rate for example and therefore the invention is less complex to implement. Additionally, the changes in power-level can be made relatively smoothly and hence there is less noise generated by frequency spreading and consequently less interference with other communication channels.

Advantageously, the amplifying means periodically varies the predetermined output power level in accordance with the sequence of power levels which permits a steady output power level to occur. This steady output power level can be used by a receiver to measure the received signal strength and to perform equalisation. Optionally, no steady output power level is provided and the sequence of power levels is known by both the transmission means and the receiving means. In such an embodiment the power variations of the received signal can be decoded or "de-spread" and the received signal strength measured and equalisation carried out on the de-spread signal.

The invention may provide different sequences of power levels and these different sequences can be used for different communication channels. Thus in a cellular system for example, adjacent cells can use different or orthogonal sequences thereby inhibiting co-channel interference.

Typically, the power levels in the sequence of power levels lies in a 20 dB power range relative to the predetermined output power level and have a step size of ±1, ±2, ±3 or ±5 dB. Optionally, the individual steps of the power level sequence may be ±0.1, ±0.2, ±0.25, ±0.3, ±0.4 or ±0.5 dB. Small step sizes are advantageous since they inhibit frequency spreading and noise interference with other channels. Also they permit a large number of different sequences to be devised which results in greater inhibition of signal fading. The transitions between power levels in a sequence of power levels may be filtered and shaped in order to inhibit spectrol spreading.

If the transmitted signal varies over a burst, e.g. a GSM burst, and has 8 variations then the coding and interleaving of the signal can be used to greatest effect. It should be noted that coding is only effective in marginal signal areas. High signal strength the coding is not required, low signal strength the coding is ineffective. If the average signal level can be kept close to the optimum point, the channel coding is used as efficiently as possible and, therefore the link budget is optimised.

BRIEF DESCRIPTION OF THE DRAWINGS

FIG. 2 shows a circuit suitable for implementing the invention;

FIG. 3 shows the structure of a normal GSM traffic burst; and

FIG. 4 shows an example of a sequence of power-levels applied to a normal GSM traffic burst in accordance with the invention.

DETAILED DESCRIPTION OF EMBODIMENTS OF THE INVENTION

Figure 1:
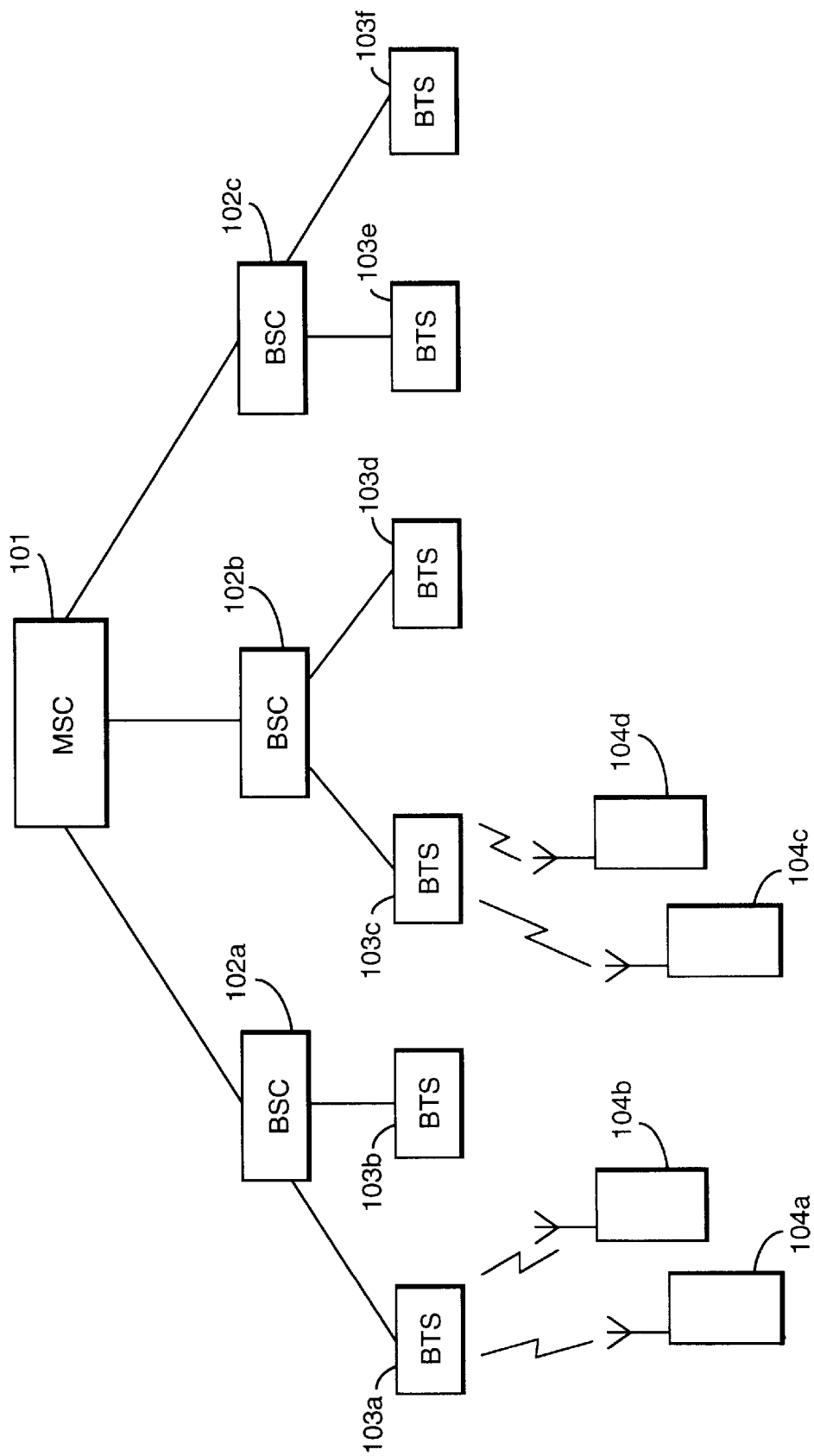
FIG. 1 shows a schematic of a GSM cellular telephone network.

Embodiments of the present invention will now be described by way of example only, and with reference to the accompanying drawings.

FIG. 1 shows a diagrammatic representation of a cellular radio telephone network such as a GSM network. Mobile Switching Centre (MSC) 101 is associated with Base Station Controllers (BSC) 102 for controlling the Base Transceiver Stations (BTS) 103. Typically, an MSC 101 is responsible for a number of radio telephone cells which would cover an urban area and its immediately adjacent environment. Each BTS 103 comprises both a receive antenna and a transmit antenna for communicating with a radio telephone 104. It is possible for a BTS 103 and a BSC 102 to be at the same geographical location and within the same housing.

The radio telephone 104 may be a mobile unit installed in a vehicle, a so called transportable unit or a hand held portable unit. The radio telephone 104 comprises an antenna for receiving and transmitting information between the radio telephone 104 and the BTS 103, a transceiver, a keypad and display. Such features and others are conventionally found in a radio telephone 104, and since these aspects are not directly relevant to the instant invention no further details will be given here, except to say that a microprocessor is employed to control the basic functions of the radio telephone 104. Alternatively, the telephone functions may be controlled by a master microcomputer, while the keypad and display functions are under the control of a separate slave microcomputer coupled to communicate with the master microcomputer.

As described earlier, the output power level of a radio telephone 104 can be varied in response to requests from a base station BTS 103. Typical apparatus for performing such control in a radio telephone 104 is shown in FIG. 2. The transmitter power output stage of the radio telephone 104 comprises a power module 201 including a voltage controlled variable gain amplifier 202. The power module amplifies signals from mixer 208, which comprise signals from the AF or baseband section 209 of the radio telephone 104 and the local oscillator L.O. 207. The power output of module 201 is determined by control voltage Vc applied to the amplifier 202. The output power of module 201 may be maintained at a nominal uniform level by the use of a conventional level control circuit (not shown) in the form of a negative feed back loop. The control voltage Vc to be applied to the amplifier 202 is determined by microprocessor 205 in response to a request received from a BTS 103 to increase or decrease the output power of the transmitter. A set of values indicative of the set of control voltages to be applied to the amplifier 202 are stored in EEPROM memory 206. The values stored in memory 206 are used by the microprocessor 205 to apply an appropriate signal to a digital-to-analogue converter (DAC) 204 which in turn applies the appropriate control voltage Vc to the amplifier 202.

In accordance with the present invention, memory 206 also stores a second set of values indicative respectively of a set of voltages to be superimposed on the control voltage Vc to vary or spread the output power level from the transmitter from the nominal uniform level determined by the control voltage Vc. Under control of the MPU 205 respective values of the second set of values are sequentially applied to the DAC 204, as for example least significant bits, in order to sequentially vary the output power level of the radio telephone 104. Providing the power module 201 has the appropriate filtering for ramp-up and down signal shaping, spectrum spreading can be minimized.

By way of a particular example, an embodiment in accordance with the invention as applied to the GSM cellular system is now described. The structure of a normal GSM data burst is shown in FIG. 3. A normal GSM data burst comprises the following sequence of bits; 8.25 ramp bits, 3 guard bits (set to Ø), 57 data bits, a stealing flag bit which indicates whether or not the burst is being used for a purpose other than speech transmission such as transmitting control messages, a training sequence of 26 bits for allowing a receiver to precisely determine the position of a useful signal inside a reception window, and to have a good idea of any distortions occurring during transmission of the burst, another stealing flag bit, 57 further data bits and 3 more guard bits. A combination of the guard bits with the data bits results in two fields of 60 bits separated by the training sequence and stealing flag bits. Dividing these two fields into groups of 10 bits results in 12 groups of bits equally divided between the two fields. Each of these groups of 10 bits is transmitted at a power level spread from the nominal power level power level in accordance with the second set of values stored in memory 206 and read by the MPU 205 for programming DAC 204 and controlling the amplifier 202. The sequence defined by the second set of values may extend over a number of GSM bursts before being repeated, for example, every 10 bursts, or can be confined to a single burst or even six groups at a time. The variations in the output power level can be by any amount desired by the designer of the system. Suitably, the variation in output power level may fall within the power range separating the predetermined output power levels defined by the system for overcoming normal fading and ensuring efficient use and re-use of the available frequency space in adjacent cells. In the GSM system the respective predetermined output power levels are spaced apart by 2 dB. Thus, there exists a total range of 4 dB in possible output power level variations at a given predetermined output power level, before encroaching on an adjacent predetermined output power level.

The variation in output power levels can be in steps of 0.5 dB, 0.3 dB, 0.25 dB, 0.2 dB or 0.1 dB for example. The smaller the separation in power levels the greater the number of power levels available to be used in a sequence. The variation in output power levels inhibits burst errors due to Rayleigh fading by effectively randomising the phases. The fading signal is multiplied by the random spreading signal. This has the effect of shortening the length of the error bursts. Thus, the interleaving depth of a GSM signal can be reduced to a simple traffic burst. Reducing the interleaving depth reduces the transmission delay and therefore the speech quality is improved. The greater the number of available power levels for varying the output power level the greater the randomisation of the fading signal and hence the greater the inhibition of Rayleigh fading. However, the smaller the steps between power levels the less reliable the detection of the variation in output power levels becomes due to noise in the receiver. A compromise needs to be made between the amount or number of variations possible and the reliability required in detecting the variations.

FIG. 4 shows an example of a normal GSM traffic channel burst having the power envelope varied or spread in accordance with the present invention. The ramp bits 401, stealing flags 403 and training sequence bits 404 are at the nominal output power level set by the radio telephone. The two data and guard bit fields 402, 405 are split into groups of 10 bits each transmitted at one of the available second set of power levels and in accordance with the sequence stored in memory 206. As shown in FIG. 4 the second set of power levels are separated by 0.5 dB, although other separations may be possible.

In order for Rayleigh fading to be most effectively inhibited, the BTS 103 should also comprise apparatus in accordance with the invention. Thus, in a radio telephone network, such as a GSM network, in which both the radio telephones 104 and the BSTs 103 operate in accordance with the instant invention Rayleigh fading should be substantially inhibited.

In order for a receiver to be able to equalise an incoming signal it requires at least a quasi-stationary signal or some knowledge of the incoming signal. Thus, it is desirable that the spreading sequences used are known to both the receiving and transmitting apparatus be they either radio telephones 104 or BTSs 103 so that the receiver can de-spread the power envelope. Also, the receiver needs to measure the received signal power, although in the foregoing example it could be measured over the training sequence power since that is constant at a nominal level. However, it is preferable to measure the power variation over the whole of burst and to do that the whole of the signal must be de-spread.

One way of performing power measurement and equalisation is to make the spreading sequences pseudo-random, i.e. one of n possible sequences is used at any given moment.

The radio telephone 104 or BTS 103 can estimate which sequence was used and use that information to pre-bias the equalisation and power measurement circuits so that they function correctly.

Clearly, an incorrect decision regarding which spreading sequence was used will affect the performance of the equaliser. However, if only a small number of possible sequences are used, the chances of erroneous decision can be made significantly small such that if an error occurs in this estimation process, then a significant number of errors would have occurred in the transmitted signal in any case.

Spreading the power envelope in accordance with the invention can also reduce co-channel interference. If each cell has a spreading sequence which is orthogonal to the spreading sequences used in adjacent cells, then the average co-channel interference will be limited to a group of 10 bits.

Since these bits are interleaved over the traffic burst the channel coding will be able to correct the errors.

Ideally, the variation in the output power level envelope should be the inverse of the Rayleigh fading distribution. Although in a typical environment and deployment the exact nature of the Rayleigh fading signal is not known, the probability density function of the signal is known since it corresponds to the well known Rayleigh distribution. Therefore, an 'inverse' signal can be generated which 'on average' produces a constant power level at the radio telephone of BTS. This level will be lower than the level used if a constant signal was transmitted thereby extending the range and lowering interference. This may change from cell to cell and even within a cell. Thus, a radio telephone will need to have stored in its memory 206 all the spreading sequences used by the different cells. This is likely not to be too onerous or expensive in terms of memory storage space since the Rayleigh fading distributions could be classified into a number of types (e.g. 5) and when a radio telephone moves into a new cell it is told the Rayleigh fading type for that cell and varies its power output level envelope accordingly. Of course, to inhibit co-channel interference adjacent cells will have to have different spreading sequences regardless of the Rayleigh fading distribution in those cells.

Optionally, the BTS 103 can transmit the appropriate spreading sequence to a radio telephone 104 on its entering a respective cell, thus obviating the need for extra memory storage for many different spreading sequences. If the Rayleigh fading distribution changes throughout a cell, the BTS 103 or radio telephone 104 can indicate such a change to each other and an appropriate spreading sequence can be chosen and used for communication with that particular radio telephone.

In view of the foregoing description it will be evident to a person skilled in the art that various modifications may be made within the scope of the invention. In particular, that apparatus and method in accordance with the present invention can be employed by base stations as well as radio telephones. Additionally, although the present invention can be used instead of frequency hopping, it may also be used in conjunction with frequency hopping.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims may be formulated to such features during prosecution of this application or of any such further application derived therefrom.

What I claim is:

1. Radio communication apparatus for inhibiting radio signal Rayleigh fading comprising output power amplifying means responsive to a control signal from an output power control means for varying a predetermined output power level from the output power amplifying means, in accordance with a sequence of power levels, during the transmission of a particular communication channel, wherein the apparatus is adapted to divide data into groups prior to transmission over said particular communication channel and wherein respective groups are transmitted at respective power levels over said particular communication channel in accordance with said sequence of power levels.

2. Radio communication apparatus according to claim 1, wherein the predetermined output power level is selectable from a range of predetermined power levels.

3. Radio communication apparatus according to claim 2, wherein the predetermined output power level is a part of a set of radio system defined power levels, and the predetermined output power level is variable between adjacent power levels of said set of radio system defined power levels in accordance with said sequence of power levels.

4. Radio communication apparatus according to claim 1, wherein transitions between respective power levels are filtered and shaped to inhibit spectral spreading.

5. Radio communication apparatus according to claim 1, wherein the control means is operative to periodically control the amplifying means in accordance with said sequence of power levels.

6. Radio communication apparatus according to claim 1, wherein the power control means is operative to control the amplifying means in accordance with different sequences of power levels.

7. Radio communication apparatus for inhibiting radio signal Rayleigh fading comprising output power amplifying means responsive to a control signal from an output power control means for varying a predetermined output power level from the output power amplifying means in accordance with a sequence of power levels wherein the apparatus is adapted to divide data into groups prior to transmission and wherein respective groups are transmitted at respective power levels in accordance with said sequence of power levels, wherein the control means is operative to periodically control the amplifying means in accordance with said sequence of power levels, and wherein said radio communication apparatus is operative for a GSM radio telephone network, wherein 3 guard bits and 57 data bits on each side of the midamble of a data burst are divided into respective groups of 10 bits for transmission at respective power levels in said sequence of power levels.

8. Radio communication apparatus for inhibiting radio signal Rayleigh fading comprising output power amplifying means responsive to a control signal from an output power control means for varying a predetermined output power level from the output power amplifying means in accordance with a sequence of power levels wherein the apparatus is adapted to divide data into groups prior to transmission and wherein respective groups are transmitted at respective power levels in accordance with said sequence of power levels, wherein the power levels in said sequence of power levels lie in a 20 dB power range relative to said predetermined output power level and have a step size of $\pm 1$, $\pm 2$, $\pm 3$ or $\pm 5$ dB.

9. Radio communication apparatus for inhibiting radio signal Rayleigh fading comprising output power amplifying means responsive to a control signal from an output power control means for varying a predetermined output power level from the output power amplifying means in accordance with a sequence of power levels wherein the apparatus is adapted to divide data into groups prior to transmission and wherein respective groups are transmitted at respective power levels in accordance with said sequence of power levels, wherein the sequence of power levels is a pseudo-random sequence.

10. Radio communication apparatus for inhibiting radio signal Rayleigh fading comprising output power amplifying means responsive to a control signal from an output power control means for varying a predetermined output power level from the output power amplifying means in accordance with a sequence of power levels, wherein the apparatus is adapted to divide data into groups prior to transmission and wherein respective groups are transmitted at respective power levels in accordance with said sequence of power levels, wherein the predetermined output power level is selectable from a range of predetermined power levels, wherein the predetermined output power level is a part of a set of radio system defined power levels, and the predetermined output power level is variable between adjacent power levels of said set of radio system defined power levels in accordance with said sequence of power levels, and wherein the power levels in said sequence of power levels lie in a 4 dB range relative to the predetermined output power level and have a step size of ±0.1, ±0.2, ±0.25, ±0.3, ±0.4, or ±0.5 dB.

11. A method for inhibiting radio signal Rayleigh fading between a transmission means and a receiving means in a communication system comprising varying a predetermined output power level output from the transmission means, in accordance with a sequence of power levels, during the transmission of a particular communication channel, wherein data is divided into groups prior to transmission from the transmission means over said particular communication channel and respective groups are transmitted at respective power levels over said particular communication channel in accordance with said sequence of power levels.

12. A method according to claim 11, wherein the predetermined output power level is selectable from a range of predetermined power levels.

13. A method according to claim 12, wherein the predetermined output power level is a part of a set of radio system defined power levels, and the predetermined output power level is variable between adjacent power levels of said set of radio system defined power levels in accordance with said sequence of power levels.

14. A method according to claim 11, wherein transitions between respective power levels and filtered and shaped to inhibit spectral spreading.

15. A method according to claim 11, wherein said sequence of power levels is known by both the transmission means and the receiving means.

16. A method according to claim 11, wherein the predetermined output power level is periodically varied in accordance with said sequence of power levels.

17. A method according to claim 11, wherein the predetermined output power level is varied in accordance with different sequences of power levels.

18. A method according to claim 17, wherein predetermined output power levels of radio signals for different communication channels are varied in accordance with different sequences of power levels.

19. A method for inhibiting radio signal Rayleigh fading between a transmission means and a receiving means in a communication system comprising varying a predetermined output power level output from the transmission means in accordance with a sequence of power levels wherein data is divided into groups prior to transmission from the transmission means and respective groups are transmitted at respective power levels in accordance with said sequence of power levels, wherein the predetermined output power level is periodically varied in accordance with said sequence of power levels, and wherein for a GSM radio telephone network, further comprising dividing 3 guard bits and 57 data bits on respective sides of the midamble of a data burst into 12 groups of 10 bits and transmitting respective groups of 10 bits at respective power levels in said sequence of power levels.

20. A method for inhibiting radio signal Rayleigh fading between a transmission means and a receiving means in a communication system comprising varying a predetermined output power level output from the transmission means in accordance with a sequence of power levels wherein data is divided into groups prior to transmission from the transmission means and respective groups are transmitted at respective power levels in accordance with said sequence of power levels, wherein power levels in said sequence of power levels lie in a 20 dB power range relative to said predetermined output power level and have a step size of 1, 2, 3 or 5 dB.

21. A method for inhibiting radio signal Rayleigh fading between a transmission means and a receiving means in a communication system comprising varying a predetermined output power level output from the transmission means in accordance with a sequence of power levels wherein data is divided into groups prior to transmission from the transmission means and respective groups are transmitted at respective power levels in accordance with said sequence of power levels, wherein the power levels in said sequence of power levels lie in a 4 dB range relative to the predetermined output power level and have a step size of ±0.1, ±0.2, ±0.25, ±0.3, ±0.4, or ±0.5 dB.

22. A method for operating a mobile station, comprising steps of:

storing data in a memory of the mobile station, the stored data specifying at least one RF transmitter power spreading sequence;

transmitting information from the mobile station to a base station during at least one assigned time slot; and during the step of transmitting, varying the RF transmitter power of the mobile station in accordance with the stored data.

23. A method as in claim 22, wherein the step of storing comprises a preliminary step of receiving the data from a base station.

24. A method for operating a mobile station, comprising steps of:

storing data in a memory of the mobile station, the stored data specifying at least one RF transmitter power spreading sequence;

transmitting information from the mobile station to a base station during at least one assigned time slot; and during the step of transmitting, varying the RF transmitter power of the mobile station in accordance with the stored data, wherein the stored data causes the RF transmitter power to be varied, ideally, as an inverse of a Rayleigh fading distribution.

25. A method for operating a mobile station, comprising steps of:

storing data in a memory of the mobile station, the stored data specifying at least one RF transmitter power spreading sequence;

transmitting information from the mobile station to a base station during at least one assigned time slot; and during the step of transmitting, varying the RF transmitter power of the mobile station in accordance with the stored data, wherein the stored data causes the RF transmitter power to be varied in a 4 dB range relative to a predetermined output power level and to have a step size of ±0.1, ±0.2, ±0.25, ±0.3, ±0.4, or ±0.5 dB.

26. A method for operating a mobile station, comprising steps of:

storing data in a memory of the mobile station, the stored data specifying at least one RF transmitter power spreading sequence;

transmitting information from the mobile station to a base station during at least one assigned time slot; and during the step of transmitting, varying the RF transmitter power of the mobile station in accordance with the stored data, wherein the stored data causes the RF transmitter power to be varied in a 20 dB range relative to a predetermined output power level and to have a step size of ±1, ±2, ±3 or ±5 dB.

* * * * *